(12) United States Patent
Lin et al.

(10) Patent No.: US 9,847,403 B2
(45) Date of Patent: Dec. 19, 2017

(54) SEMICONDUCTOR DEVICE AND A FABRICATION METHOD THEREOF

(71) Applicant: UNITED MICROELECTRONICS CORP., Hsin-Chu (TW)

(72) Inventors: Chien-Ting Lin, Hsinchu (TW); Shih-Fang Tzou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/855,357

(22) Filed: Sep. 15, 2015

(65) Prior Publication Data
US 2017/0047422 A1    Feb. 16, 2017

(30) Foreign Application Priority Data
Aug. 10, 2015 (TW) .............................. 104125896 A

(51) Int. Cl.
| H01L 21/768 | (2006.01) |
| H01L 29/66 | (2006.01) |
| H01L 29/78 | (2006.01) |
| H01L 23/535 | (2006.01) |

(52) U.S. Cl.
CPC .... *H01L 29/6656* (2013.01); *H01L 21/76897* (2013.01); *H01L 23/535* (2013.01); *H01L 29/66795* (2013.01); *H01L 29/785* (2013.01)

(58) Field of Classification Search
CPC ............. H01L 21/02063; H01L 21/049; H01L 21/28531; H01L 21/76805; H01L 21/76897; H01L 21/823475; H01L 21/823871; H01L 29/66606; H01L 29/78618; H01L 29/6656; H01L 29/785; H01L 23/535; H01L 29/667; H01L 29/66795; H01L 21/823431; H01L 21/823821

See application file for complete search history.

(56) References Cited

U.S. PATENT DOCUMENTS

| 8,791,528 | B2 | 7/2014 | Lin | |
| 2004/0018707 | A1* | 1/2004 | Terauchi | H01L 21/76895 438/586 |
| 2004/0209427 | A1* | 10/2004 | Huang | H01L 21/76802 438/262 |
| 2007/0077754 | A1* | 4/2007 | Ngo | H01L 21/76802 438/627 |
| 2007/0264824 | A1* | 11/2007 | Siew | H01L 21/02074 438/672 |
| 2009/0102058 | A1* | 4/2009 | Hsieh | H01L 21/76814 257/774 |
| 2011/0042752 | A1* | 2/2011 | Mayuzumi | H01L 21/28518 257/369 |
| 2012/0052667 | A1* | 3/2012 | Kim | H01L 29/66545 438/586 |
| 2012/0175711 | A1 | 7/2012 | Ramachandran | |

(Continued)

*Primary Examiner* — Bitew Dinke
(74) *Attorney, Agent, or Firm* — Winston Hsu

(57) ABSTRACT

A semiconductor device includes a substrate, gate electrodes, spacers and contact structures. The gate electrodes are disposed on the substrate, and the spacers are disposed on the sidewalls of the gate electrodes. Each of the spacers has an inner sidewall and an outer sidewall. The contact structure is disposed between the gate electrodes, and its bottom is in direct contact with all the region of the outer sidewall of the spacers.

8 Claims, 7 Drawing Sheets

(56) References Cited

U.S. PATENT DOCUMENTS

| | | | |
|---|---|---|---|
| 2013/0241008 A1* | 9/2013 | Choi | H01L 29/4958 257/410 |
| 2013/0341695 A1* | 12/2013 | Fazan | H01L 21/84 257/296 |
| 2014/0035141 A1* | 2/2014 | Cheng | H01L 21/76897 257/751 |
| 2014/0361381 A1* | 12/2014 | Hung | H01L 29/458 257/384 |
| 2015/0171091 A1* | 6/2015 | Lytle | H01L 29/665 257/369 |
| 2015/0214319 A1* | 7/2015 | Li | H01L 29/4966 257/288 |
| 2016/0020205 A1* | 1/2016 | Song | H01L 27/0629 257/379 |
| 2016/0043075 A1* | 2/2016 | Lavoie | H01L 27/088 257/365 |
| 2016/0049394 A1* | 2/2016 | Shin | H01L 27/0886 257/401 |
| 2016/0133525 A1* | 5/2016 | Lee | H01L 29/665 438/589 |
| 2016/0181399 A1* | 6/2016 | Jun | H01L 29/66553 438/294 |

* cited by examiner

SEMICONDUCTOR DEVICE AND A FABRICATION METHOD THEREOF

BACKGROUND OF THE INVENTION

1. Field of the Invention

The present invention relates generally to a semiconductor device, and more particularly to a semiconductor device with a conductive contact structure.

2. Description of the Prior Art

Along with the continuous miniaturization of the Integrated Circuits (IC), the feature size of each semiconductor device within the ICs also shrinks continuously. In order to overcome electrical or processing limitations arising from the miniaturization of semiconductor devices, semiconductor manufacturers have found out several solutions. For example, for a transistor device with a polysilicon gate, some disadvantages, such as boron penetration and depletion effect often occur and cause inferior performance of the transistor device. In order to solve these drawbacks, some semiconductor manufacturers adopt a gate-last process to replace the conventional polysilicon gate with a metal gate having metal electrode. Additionally, along with the shrinkage between two adjacent gate structures, semiconductor manufacturers also correspondingly invent a method for self-aligning a contact structure so as to overcome drawbacks due to the insufficient space between the two adjacent gate structures.

However, even though the above-mentioned semiconductor device adopts the metal gate and the self-aligned contact, there are still some technical problems need to be overcome. For example, when the space between two adjacent gate structures is less than a certain value, such as 10 nm, severe misalignment problems often happen during the process of fabricating self-aligned contacts, which leads to the lateral shift of the self-aligned contacts. Once the self-aligned contacts displaced from their predetermined positions, the contact areas between the self-aligned contacts and the underlying active regions are inevitably reduced. As a result, the contact resistance is increased.

Accordingly, in order to overcome the above-mentioned drawbacks, there is still a need to provide a modified structure having a metal gate and a self-aligned contact structure and a method thereof.

SUMMARY OF THE INVENTION

According to one embodiment of the present invention, a semiconductor device is provided and includes a substrate, gate electrodes, spacers and contact structures. The gate electrodes are disposed on the substrate, and the spacers are disposed on the sidewalls of the gate electrodes. Each of the spacers has an inner sidewall and an outer sidewall. The contact structure is disposed between the gate electrodes, and its bottom is indirect contact with all the region of the outer sidewall of the spacers.

According to another embodiment of the present invention, a method of fabricating a semiconductor device is provided and includes the following steps. First, a substrate having fin-shaped protrusions on its surface is provided. At least two gate stacks are formed on the substrate. A sacrificial material is formed so that it covers the gate stacks and the fin-shaped protrusions. Portions of the sacrificial material are then replaced with an interlayer dielectric so that the interlayer dielectric is in direct contact with portions of the fin-shaped protrusions. After the step of replacing the sacrificial material with the interlayer dielectric, other portions of the sacrificial material are replaced with a contact structure so that the interlayer dielectric is in direct contact with other portions of the fin-shaped protrusions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
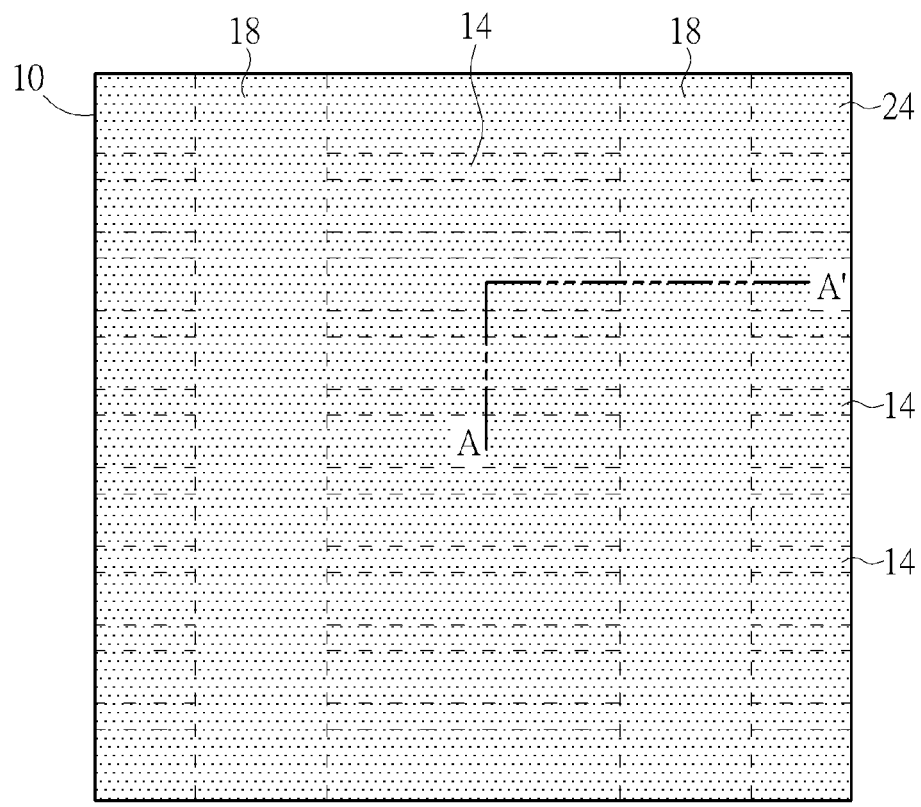
FIGS. 1-12 illustrate a method for fabricating a semiconductor device according to preferred embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

It will be understood that when an element or layer is referred to as being "on," "engaged to," "connected to" and/or "coupled to" another element or layer, it can be directly on, engaged, connected or coupled to the other element or layer or intervening elements or layers may be presented. In contrast, when an element is referred to as being "directly on," "directly engaged to," "directly connected to" and/or "directly coupled to" another element or layer, there are no intervening elements or layers present. Other words used to describe the relationship between elements should be interpreted in a like fashion (e.g., "between" versus "directly between," "adjacent" versus "directly adjacent," etc.) As used herein, the term "and/or" may include any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

Spatially relative terms, such as "inner," "outer," "beneath," "below," "lower," "above," "upper" and the like, may be used herein for ease of description to describe one element and/or feature's relationship to another element(s) and/or feature(s) as illustrated in the figures. Spatially relative terms may be intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
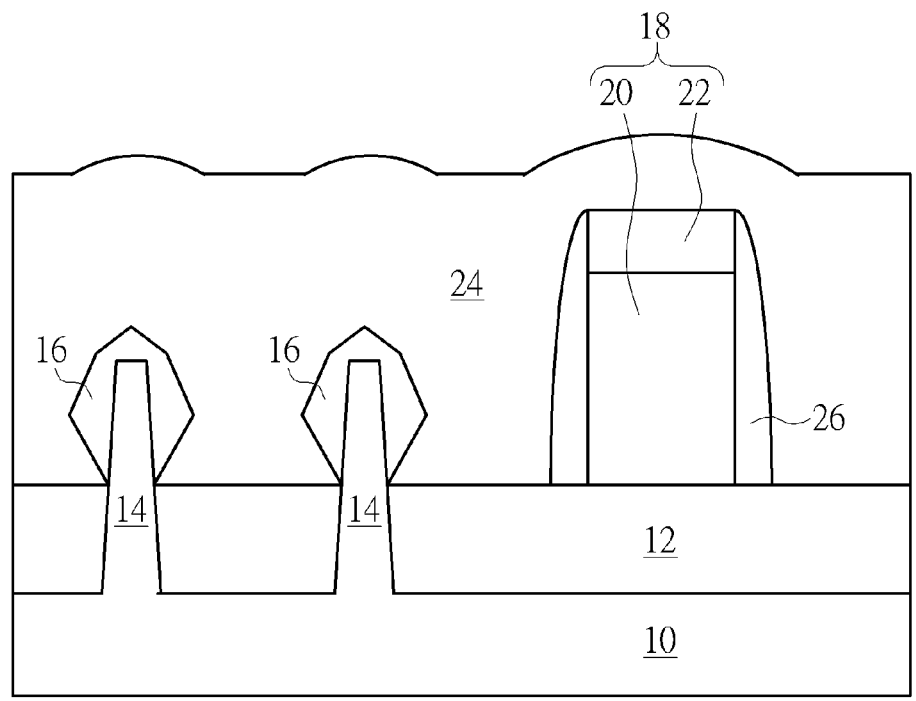

FIGS. 1-11 illustrate a method for fabricating a semiconductor device according to a first preferred embodiment of the present invention. As shown in FIG. 1 and FIG. 2, at this time, there are fin-shaped protrusions, epitaxial layers, shallow trench isolation, gate stacks, spacers and sacrificial material disposed on the substrate.

For example, the substrate 10 may be a semiconductor substrate, and fin-shaped protrusions 14, also called fin-shaped structures, are optionally covered by the epitaxial layer 16. The shallow trench isolation 12 disposed on the substrate 10 is used to electrically isolate the adjacent fin-shaped protrusions 14. Additional doped regions (not shown), such as lightly-doped regions and/or source/drain regions, may be disposed in the epitaxial layer 16 and/or the fin-shaped protrusions 14. The doped regions may be electrically connected to a contact structure fabricated in the following process.

Gate stacks 18 may cross several fin-shaped protrusions 14, and portions of the gate stack 18 may be indirect contact with the gate stack 18. In a case where the gate stacks 18 are dummy gate structures, each of which may include interfacial layer (not shown), a sacrificial layer 20 and a cap 22 from bottom to top. The spacers 26 may be disposed on the sidewalls of the gate stacks 18.

The sacrificial material 24 is deposited by a deposition or a coating process, and it may cover the fin-shaped protrusions 14 and gate stacks 18. Also, the sacrificial material 24 may fill up the space between the gate stacks 18. The sacrificial material 24 is preferably made of insulator, which may be chosen from doped or un-doped single crystalline or polycrystalline, such as doped or un-doped silicon, silicon germanium, silicon carbide, silicon phosphide and the like. More preferably, the sacrificial material 24 is made of un-doped polysilicon. In addition, when applying an etching process onto the sacrificial material 24 in the following process, the lateral etching phenomenon may not occur.

The above-mentioned substrate 10 may be selected from a silicon substrate, a silicon-germanium substrate or a silicon-on-insulator (SOI) substrate, but not limited thereto. In a case where the surface of the substrate 10 has protruding fin structures, the bottom of each dummy gate structure 18 may surround a section of the corresponding protruding fin structure. The interfacial layer (not shown), the sacrificial layer 20 and the cap layer 22 in each dummy gate structure 18 may respectively correspond to an oxide layer, a silicon layer and a nitride layer, for example a silicon oxide layer, a polysilicon layer and a silicon nitride layer, but not limited thereto. The spacers 26 may be selected from a silicon nitride, a silicon carbide, a silicon carbon nitride, a silicon oxynitride or other suitable semiconductor compounds. The epitaxial layers 130 disposed at two sides of the dummy gate structures 18 may be selected from doped or un-doped semiconductor materials, such as silicon germanium, silicon phosphor, silicon carbon or the like. The epitaxial layers 16 may impose required stress on channel regions of the semiconductor device and accordingly improve the carrier mobility in the channel regions.

Figure 3:
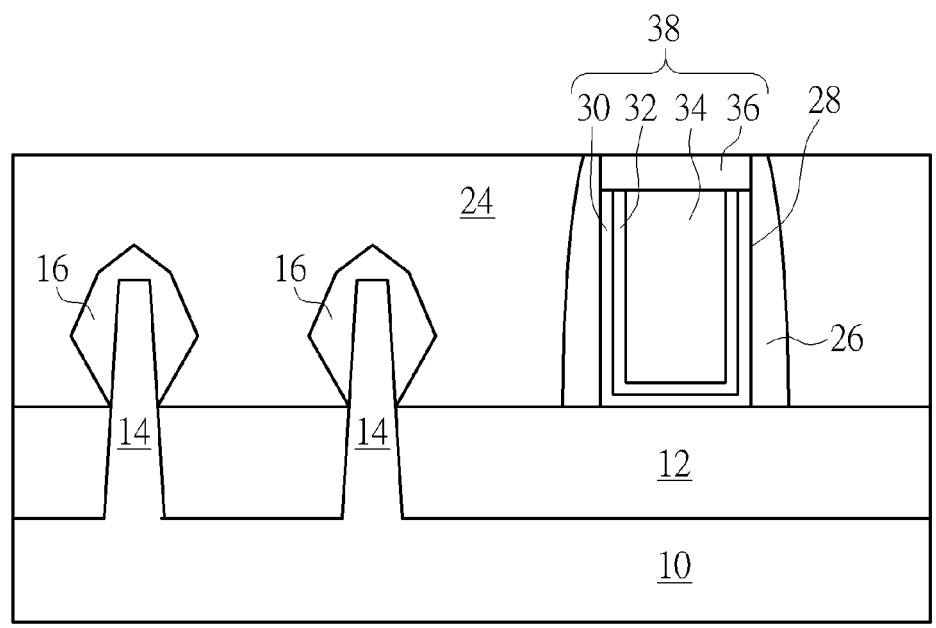

A replacement metal gate (RMG) process may be carried out so as to form a structure shown in FIG. 3. Please refer to FIG. 3; the process may at least include the following steps. First, the sacrificial layer 20 within each dummy gate structure 18 is removed in order to form a trench 28. Then, a dielectric layer 30, a work function metal layer 32 and a conductive layer 34 is sequentially filled into the trench 28. A polishing process is carried out afterwards to remove the dielectric layer 30, the work function metal layer 32 and the conductive layer 34 outside the trench 28 until the sacrificial layer 24 is exposed. Then, the dielectric layer 30, the work function metal layer 32 and the conductive layer 34 in the trench 28 is etched back until a cavity is formed. An etch mask 36 is then deposited to fill up the cavity. At this time, several metal gate structures 38 are obtained, and a conductive layer 34 in each trench 28 may act as a gate electrode of the metal gate structures 38.

In this embodiment, the metal gate preferably includes a high-k dielectric layer, a work function metal layer and a gate electrode. The work function metal layer is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. Furthermore, the material of the conductive layer 34 may include copper (Cu), aluminum (Al), titanium aluminum (TiAl), cobalt tungsten phosphide (CoWP) or any combination thereof.

Additionally, since the above-mentioned process is a gate-last process accompanied with a high-k last process, both the dielectric layer and the work function layer are preferably disposed on the sidewalls and the bottom of each trench 28. However, the present embodiment is not limited thereto. In other words, a gate-first process accompanied with a high-k first process may be applied instead. In this way, prior to the removal of the sacrificial layer, the substrate 10 within the trench 28 may be covered by the high-k dielectric layer. In addition, a barrier layer (not shown) may be optionally formed and may cover the high-k dielectric layer so that the high-k dielectric layer is not removed along with the sacrificial layer. The barrier layer may be a metal layer, such as a titanium nitride layer.

Then, an optional stress memorization technique (SMT) may be carried out to enhance the stress of the epitaxial layers 16 and/or the fin-shaped protrusions 14 disposed under the sacrificial material 24. Specifically, the stress memorization technique may include at least the following steps: performing an ion implantation process, such as a germanium ion implantation process, to implant germanium ions into the sacrificial material 24 until amorphous sacrificial material is produced. It should be noted that amorphous sacrificial material disclosed herein means it contains more than 80% amorphous materials; performing an annealing process to recrystallize the amorphous sacrificial material.

Then, a patterned mask is fabricated on the sacrificial material 24 by a photolithographic process and an etching process. The patterned mask may include several geometric features with parallel or staggered arrangements. Preferably, the patterned mask includes several rectangular openings with a staggered arrangement, and the long axes of the rectangular openings are parallel to one another, but not limited thereto.

Figure 4:
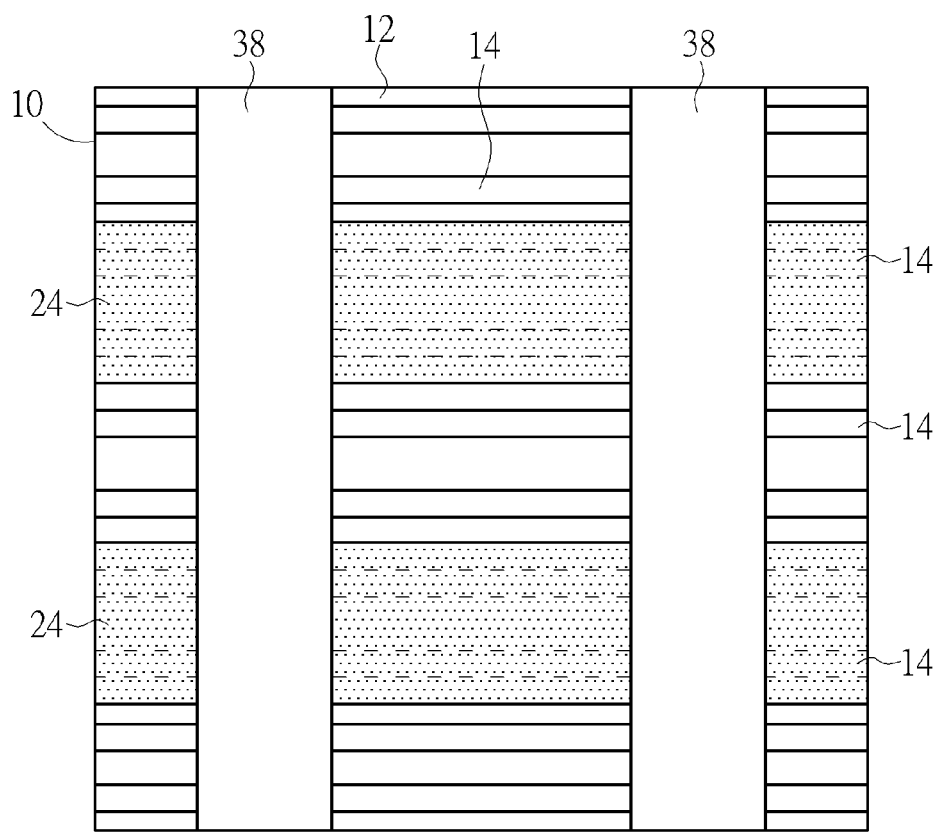

Then, as shown in FIG. 4, an etching process is applied by using the patterned mask as an etch mask until the corresponding shallow trench isolation is exposed. Through this etching process, the pattern in the patterned mask can be effectively transferred to the underlying sacrificial material 24. Besides, since the sacrificial material 24 can be etched precisely, the sidewalls of the sacrificial material 24 after being etched can be perfectly vertical.

Figure 5:
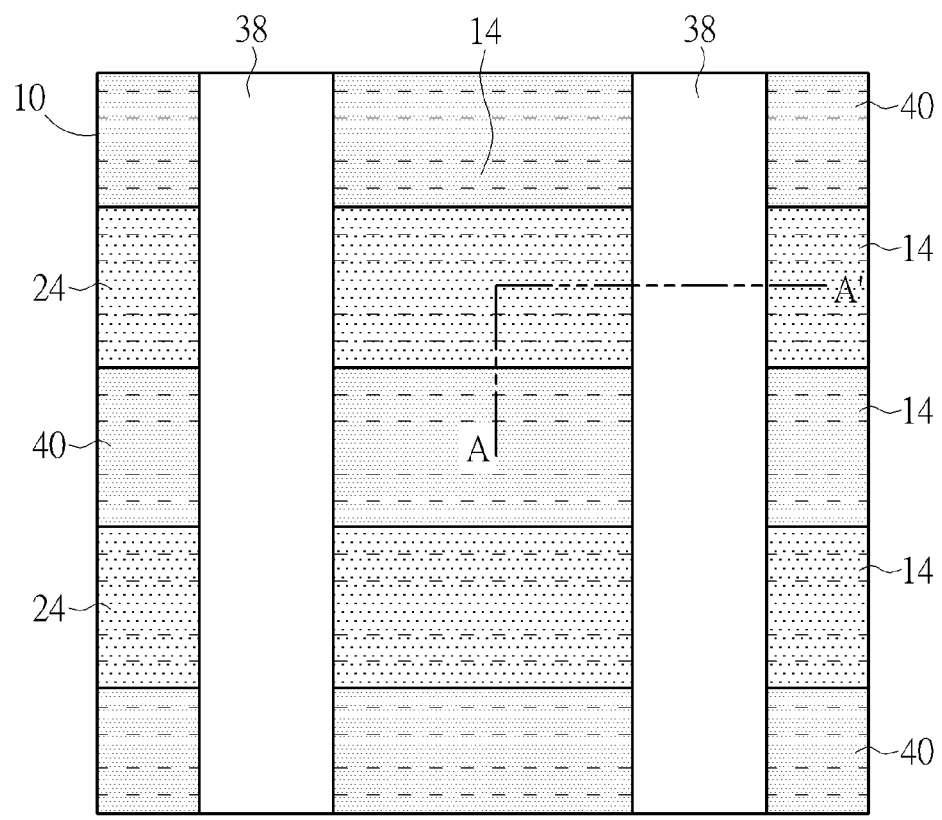
Figure 6:
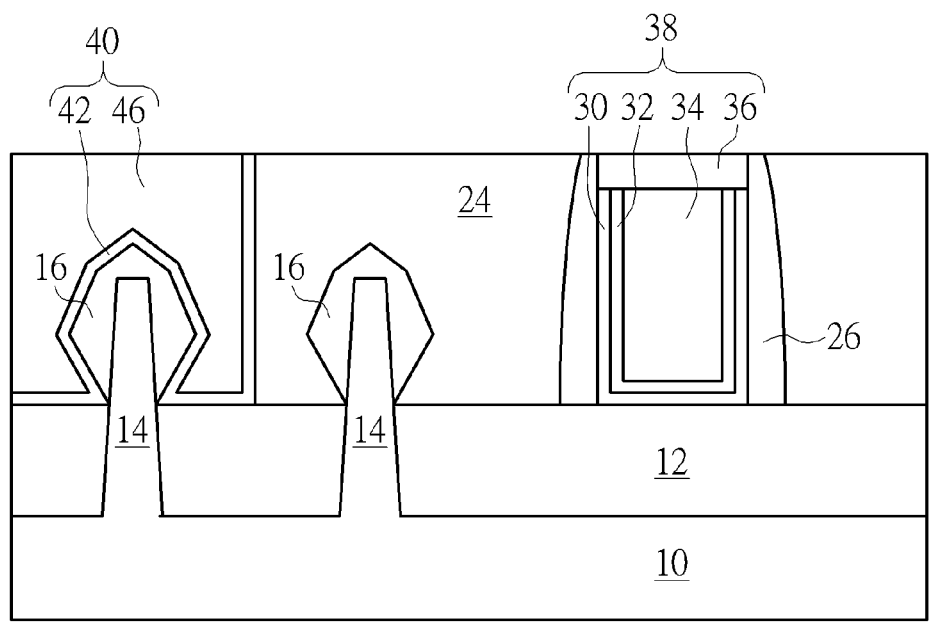

Refer to FIG. 5 and FIG. 6. A dielectric layer 42, such as a silicon nitride layer, is deposited on the sidewalls and bottom of the trench defined in the sacrificial material 24. When the deposition process is completed, the epitaxial layer 16 and the shallow trench isolation 12 can be conformally covered by the dielectric layer 42. Afterwards, by performing a deposition process, such as a flowable chemical vapor deposition (FCVD) process, a filling layer 46, such as a TEOS layer, can be filled into the trench of the sacrificial material 24. A thermal process is then carried, through which the TEOS layer can react with oxygen to produce oxide layer. After the completion of the thermal process, a planarization process may be carried out to make the top surface of the filling layer 46 be coplanar with the top surface of the etch mask 36. The dielectric layer 42 and the filling layer 46 disclosed above can constitute an interlayer dielectric 40. The purpose of the dielectric layer 42 is to prevent the underlying substrate 10 from reacting with the overlying filling layer 46, and it can be omitted according to different demands. The interlayer dielectric 40 includes at least a curved sidewall and a vertical sidewall adjacent to curved sidewall. Specifically, the curved sidewall is disposed adjacent to the sidewall of the metal gate structure 38, and the vertical sidewall is disposed adjacent to the sidewall of the sacrificial material 24.

Figure 7:
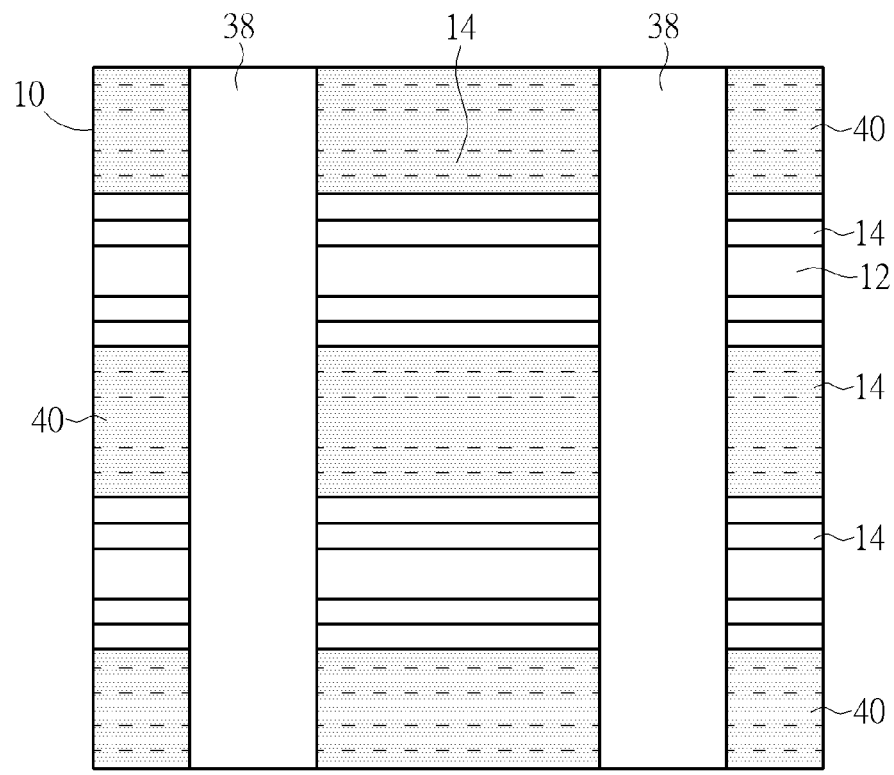

Then, as shown in FIG. 7, the sacrificial material 24 on the substrate 10 is removed completely by an etching process, and portions of the epitaxial layers 16 and portions of the shallow trench isolation 12 may be therefore exposed. After the etching process, however, there are still portions of the portions of the epitaxial layers 16 and portions of the shallow trench isolation 12 covered by the interlayer dielectric 40. It should be noted that the sacrificial material may be etched away at least 3 times greater than the interlayer dielectric 40 does during the etching process.

Figure 8:
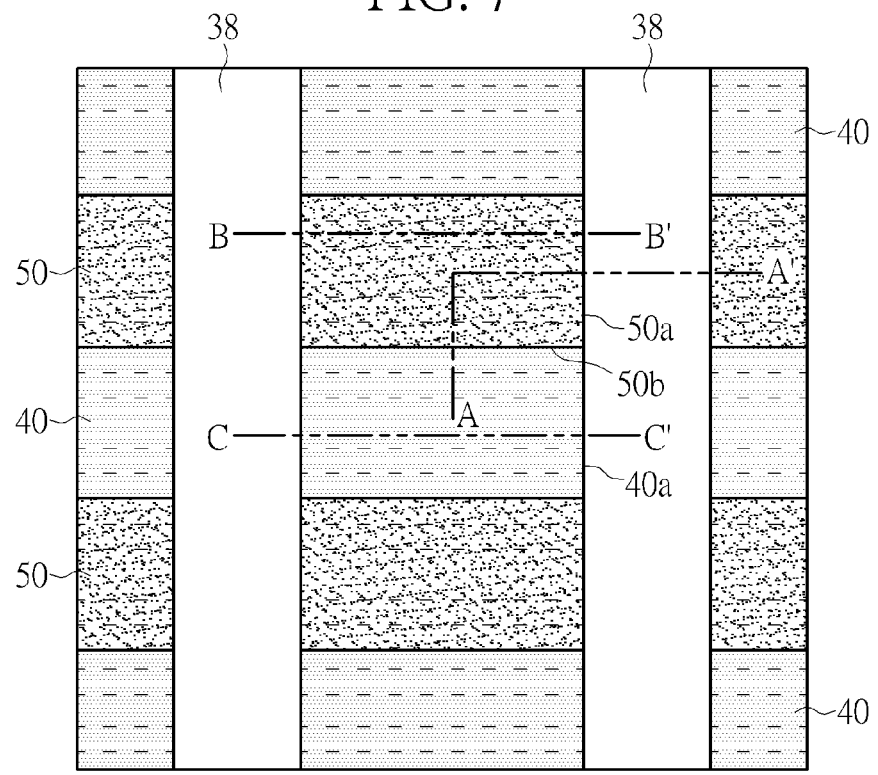
Figure 9:
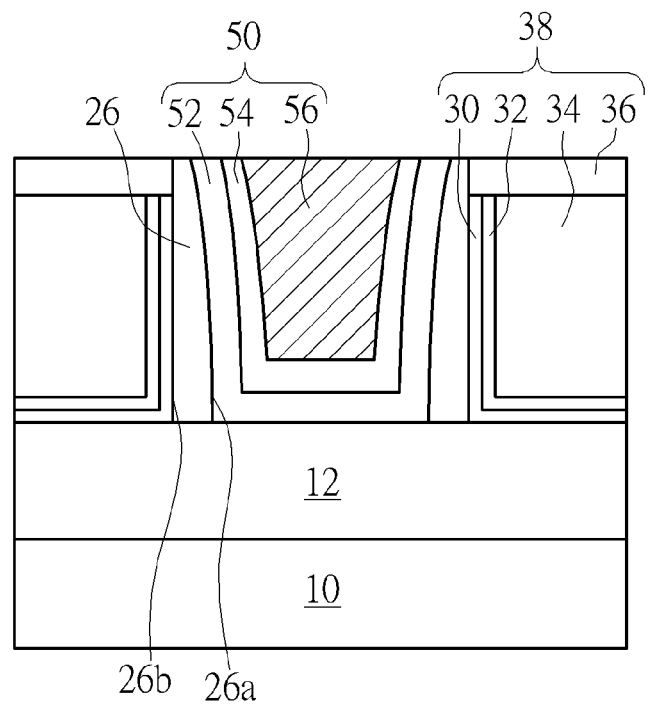
Figure 12:
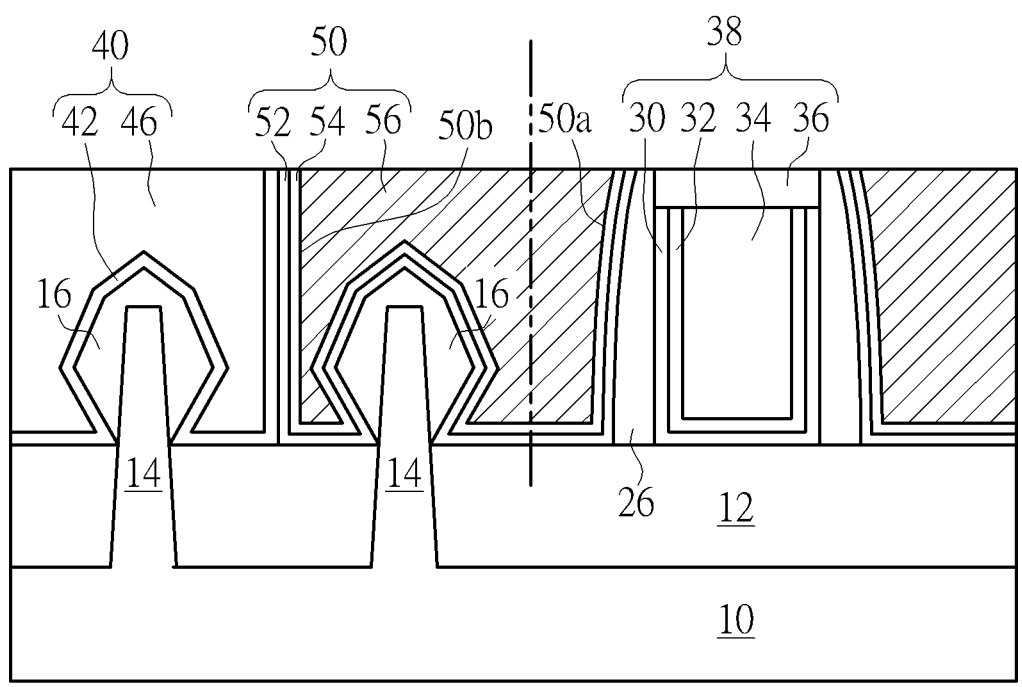

Then, as shown in FIG. 8 and FIG. 9, an adhesive layer 52, a barrier layer 54 and a conductive layer 56 are sequentially filled into the space between the interlayer dielectric 40 and between the metal gate structures 38 so as to form contact structures 50. Furthermore, it is clearly shown in FIG. 12 that each of the contact structure 50 includes at least a curved sidewall 50a and a vertical sidewall 50b, and the contact structure 50 electrically connects at least one fin-shaped protrusion 14 and the epixtaxial layer 16 thereunder. From the aspect of top view of FIG. 8, the curved sidewall 50a is adjacent and orthogonal to the vertical sidewall 50b. From the aspect of cross-sectional view of FIG. 6 and FIG. 12, the curved sidewall 50a of the contact structure 50 and the curved sidewall 40a of the interlayer dielectric 40 are both is-disposed adjacent to and in direct contact with all regions of the outer sidewalls of the spacers 26 of the metal gate structure 38, and the vertical sidewall 50b of the contact structure 50 is disposed adjacent to the vertical sidewalls of the interlayer dielectric 40.

Figure 10:
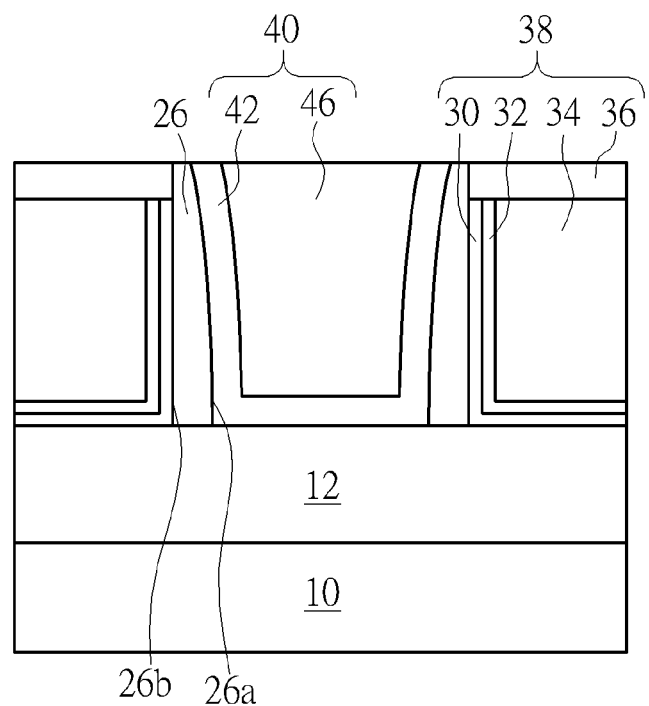

FIG. 9 is a cross-sectional diagram taken along line B-B' of FIG. 8, and FIG. 10 is a cross-sectional diagram taken along line C-C' of FIG. 8. Specifically, the adhesive layer 52 may be in direct contact with all regions of the outer sidewall 26a of the spacers 26, but is not in direct contact with the inner sidewall 26a of the spacers 26. The interlayer dielectric 40 is in direct contact with all the regions of the outer sidewall 26a of the spacer, but is spaced apart from the inner sidewall 26b of the spacer 26. Besides, the top surface of the interlayer dielectric 40 is coplanar with the top surface of the etch mask 36.

Figure 11:
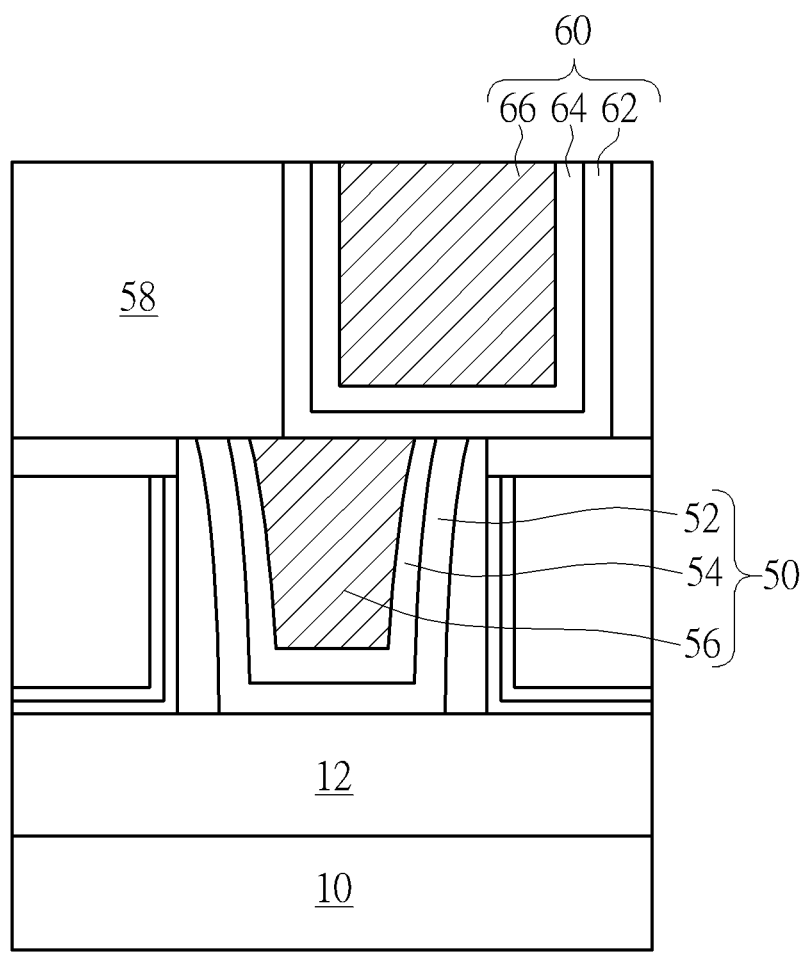

As shown in FIG. 11, another interlayer dielectric 58 may be deposited on the contact structure 50 and the metal gate structure after forming the contact structure 50. Then, by sequentially performing a photolithographic process, an etching process, a deposition process and a planarization process, a top contact structure 60 is fabricated in the interlayer dielectric 58. In the embodiment, an adhesive layer 62, a barrier layer 64 and a conductive layer 66 constitute the top contact structure 60. Because the contact structure 50 has relatively greater cross sectional area, the contact resistance between the top contact structure 60 and the contact structure 50 can be kept at a low value even if there is a misalignment between them.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor device, comprising:
a substrate;
a plurality of gate electrodes, disposed on the substrate;
spacers, disposed on the sidewalls of the gate electrodes, wherein each of the spacers has an inner sidewall and an outer sidewall;
at least a contact structure, disposed between the gate electrodes, wherein the contact structure includes at least a curved sidewall of the contact structure and at least a vertical sidewall of the contact structure adjacent and orthogonal to the curved sidewall of the contact structure and the substrate in plan view;
at least a fin-shaped protrusion disposed under the contact structure and electrically connected to the contact structure; and
an interlayer dielectric, disposed on the substrate, wherein the interlayer dielectric includes at least a curved sidewall of the interlayer dielectric and at least a vertical sidewall of the interlayer dielectric adjacent and perpendicular to the curved sidewall of the interlayer dielectric and the substrate, and the curved sidewall of the contact structure and the curved sidewall of the interlayer dielectric are in direct contact with all regions of the outer sidewall of the spacers, and the vertical sidewall of the contact structure and the vertical sidewall of the interlayer dielectric are adjacent to each other.

2. The semiconductor device of claim 1, further comprising at least two etch masks, respectively disposed on top surfaces of the gate electrodes, wherein a top surface of the contact structure is level with top surfaces of the etch masks.

3. The semiconductor device of claim 1, wherein the contact structure comprises an adhesive layer, a barrier layer and a conductive layer from bottom to top.

4. The semiconductor device of claim 3, wherein the adhesive layer is in direct contact with all regions of the outer sidewalls of the spacers.

5. The semiconductor device of claim 1, wherein the semiconductor device further comprises a top contact structure, disposed on and in direct contact with the contact structure.

6. The semiconductor device of claim 5, wherein the top contact structure comprises an adhesive layer, a barrier layer and a conductive layer from bottom to top.

7. The semiconductor device of claim 1, wherein the interlayer dielectric comprises a conformal layer and a filling layer from bottom to top.

8. The semiconductor device of claim 7, wherein the filling layer is made of silicon oxide.

* * * * *